United States Patent
Mehandru et al.

(10) Patent No.: US 11,011,620 B2
(45) Date of Patent: May 18, 2021

(54) TECHNIQUES FOR INCREASING CHANNEL REGION TENSILE STRAIN IN N-MOS DEVICES

(71) Applicant: INTEL CORPORATION, Santa Clara, CA (US)

(72) Inventors: Rishabh Mehandru, Portland, OR (US); Cory E. Weber, Hillsboro, OR (US); Anand S. Murthy, Portland, OR (US); Karthik Jambunathan, Hillsboro, OR (US); Glenn A. Glass, Portland, OR (US); Jiong Zhang, Portland, OR (US); Ritesh Jhaveri, Hillsboro, OR (US); Szuya S. Liao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 131 days.

(21) Appl. No.: 16/322,815

(22) PCT Filed: Sep. 27, 2016

(86) PCT No.: PCT/US2016/054022
§ 371 (c)(1),
(2) Date: Feb. 1, 2019

(87) PCT Pub. No.: WO2018/063166
PCT Pub. Date: Apr. 5, 2018

(65) Prior Publication Data
US 2019/0207015 A1 Jul. 4, 2019

(51) Int. Cl.
*H01L 27/092* (2006.01)
*H01L 29/66* (2006.01)
(Continued)

(52) U.S. Cl.
CPC .... *H01L 29/66636* (2013.01); *H01L 21/8238* (2013.01); *H01L 27/092* (2013.01);
(Continued)

(58) Field of Classification Search
CPC ........... H01L 29/66636; H01L 21/8238; H01L 27/092; H01L 27/0924; H01L 29/32; H01L 29/66545; H01L 29/66628
See application file for complete search history.

(56) References Cited

U.S. PATENT DOCUMENTS 7,064,392 B1    6/2006   Morishita
2006/0011983 A1   1/2006   Fitzgerald
(Continued)

FOREIGN PATENT DOCUMENTS

WO    2015047267 A1    4/2015
WO    2018063166 A1    4/2018

OTHER PUBLICATIONS

International Search Report and Written Opinion received for PCT/US2016/054022, dated Jun. 7, 2017. 12 pages.
(Continued)

*Primary Examiner* — Elias Ullah
(74) *Attorney, Agent, or Firm* — Schwabe, Williamson & Wyatt, P.C.

(57) ABSTRACT

Techniques are disclosed for forming increasing channel region tensile strain in n-MOS devices. In some cases, increased channel region tensile strain can be achieved via S/D material engineering that deliberately introduces dislocations in one or both of the S/D regions to produce tensile strain in the adjacent channel region. In some such cases, the S/D material engineering to create desired dislocations may include using a lattice mismatched epitaxial S/D film adjacent to the channel region. Numerous material schemes for achieving multiple dislocations in one or both S/D regions
(Continued)

will be apparent in light of this disclosure. In some cases, a cap layer can be formed on an S/D region to reduce contact resistance, such that the cap layer is an intervening layer between the S/D region and S/D contact. The cap layer includes different material than the underlying S/D region and/or a higher dopant concentration to reduce contact resistance.

20 Claims, 8 Drawing Sheets

(51) Int. Cl.
*H01L 21/8238* (2006.01)
*H01L 29/78* (2006.01)
*H01L 29/32* (2006.01)

(52) U.S. Cl.
CPC .......... *H01L 27/0924* (2013.01); *H01L 29/32* (2013.01); *H01L 29/66545* (2013.01); *H01L 29/66628* (2013.01); *H01L 29/66659* (2013.01); *H01L 29/66795* (2013.01); *H01L 29/785* (2013.01); *H01L 29/7848* (2013.01)

(56) References Cited

U.S. PATENT DOCUMENTS

| | | |
|---|---|---|
| 2007/0281413 A1 | 12/2007 | Li et al. |
| 2013/0095631 A1 | 4/2013 | Pagette |
| 2013/0248999 A1 | 9/2013 | Glass |
| 2014/0284626 A1 | 9/2014 | Weber |
| 2014/0346576 A1 | 11/2014 | Lu |
| 2015/0206942 A1 | 7/2015 | Glass et al. |
| 2016/0204256 A1 | 7/2016 | Jackson et al. |

OTHER PUBLICATIONS

International Preliminary Report on Patentability received for PCT/US2016/054022. dated Apr. 2, 2019. 10 pages.

Office Action from Taiwan Patent Application No. 106127351, dated Nov. 26, 2020, 19 pages.

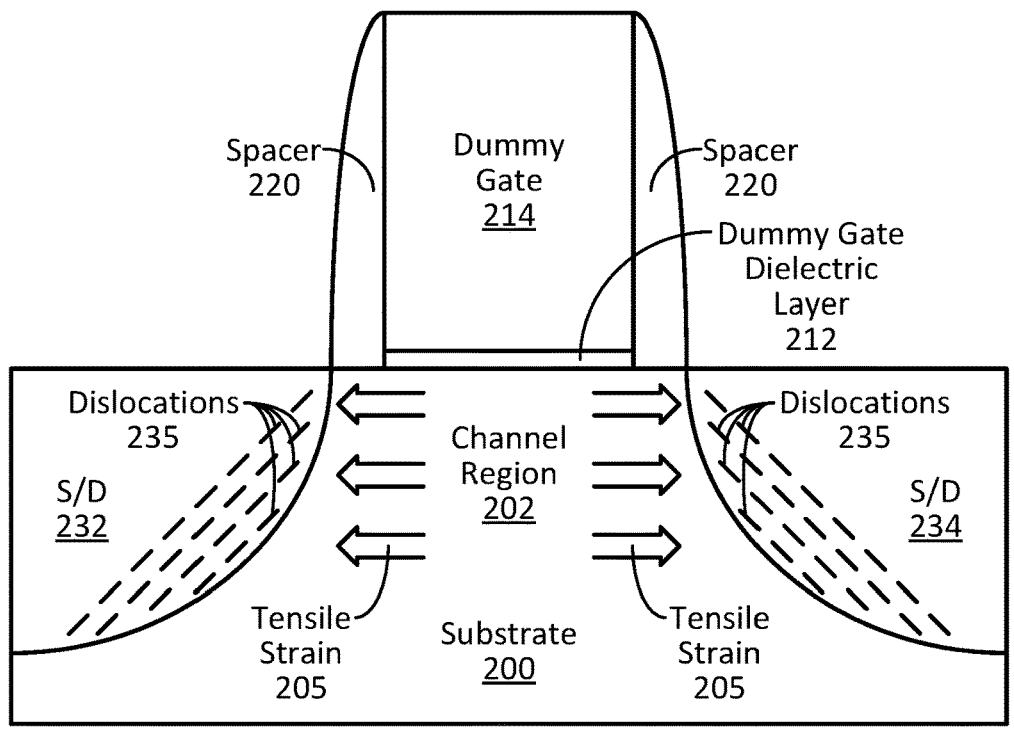
FIG. 2C
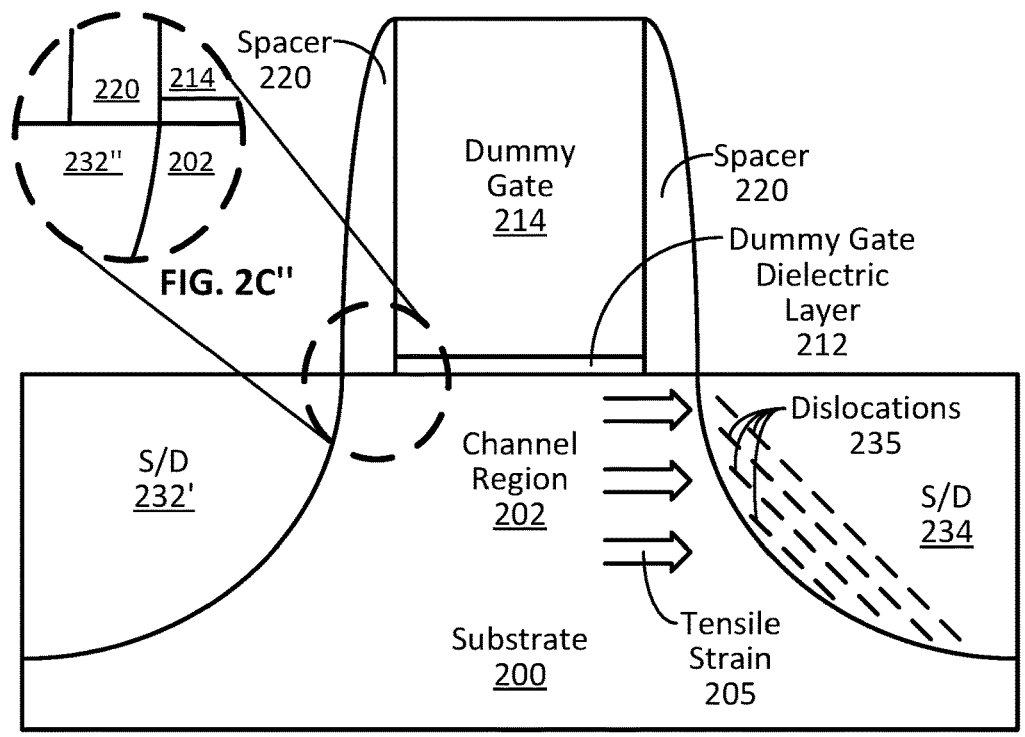
FIG. 2C'
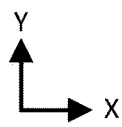

TECHNIQUES FOR INCREASING CHANNEL REGION TENSILE STRAIN IN N-MOS DEVICES

CROSS-REFERENCE TO RELATED APPLICATIONS

This patent application is a U.S. National Phase Application under 35 U.S.C. § 371 of International Application No. PCT/US2016/054022, filed on Sep. 27, 2016, the entire contents of which is hereby incorporated by reference herein.

BACKGROUND

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric layer between the gate and the channel. Complementary MOS (CMOS) structures use a combination of p-channel MOSFET (p-MOS) and n-channel MOSFET (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a nanoribbon or gate-all-around (GAA) transistor) is configured similarly to a fin-based transistor, but instead of a finned channel region where the gate is on three portions (and thus, there are three effective gates), one or more nanowires are used for the channel region and the gate material generally surrounds each nanowire.

BRIEF DESCRIPTION OF THE DRAWINGS

FIGS. 2A-G illustrate example integrated circuit structures (IC) that are formed when carrying out the method of FIG. 1, in accordance with some embodiments of the present disclosure.

FIGS. 2C', 2D', and 2G' illustrate the example structures of FIGS. 2C, 2D, and 2G, respectively, including variations that may be employed for the method of FIG. 1, in accordance with some embodiments of the present disclosure.

FIG. 2C" is a blown out view showing a portion of FIG. 2C' to illustrate that the S/D regions as variously described herein may at least partially extend under the gate spacers, in accordance with some embodiments.

Figure 1:
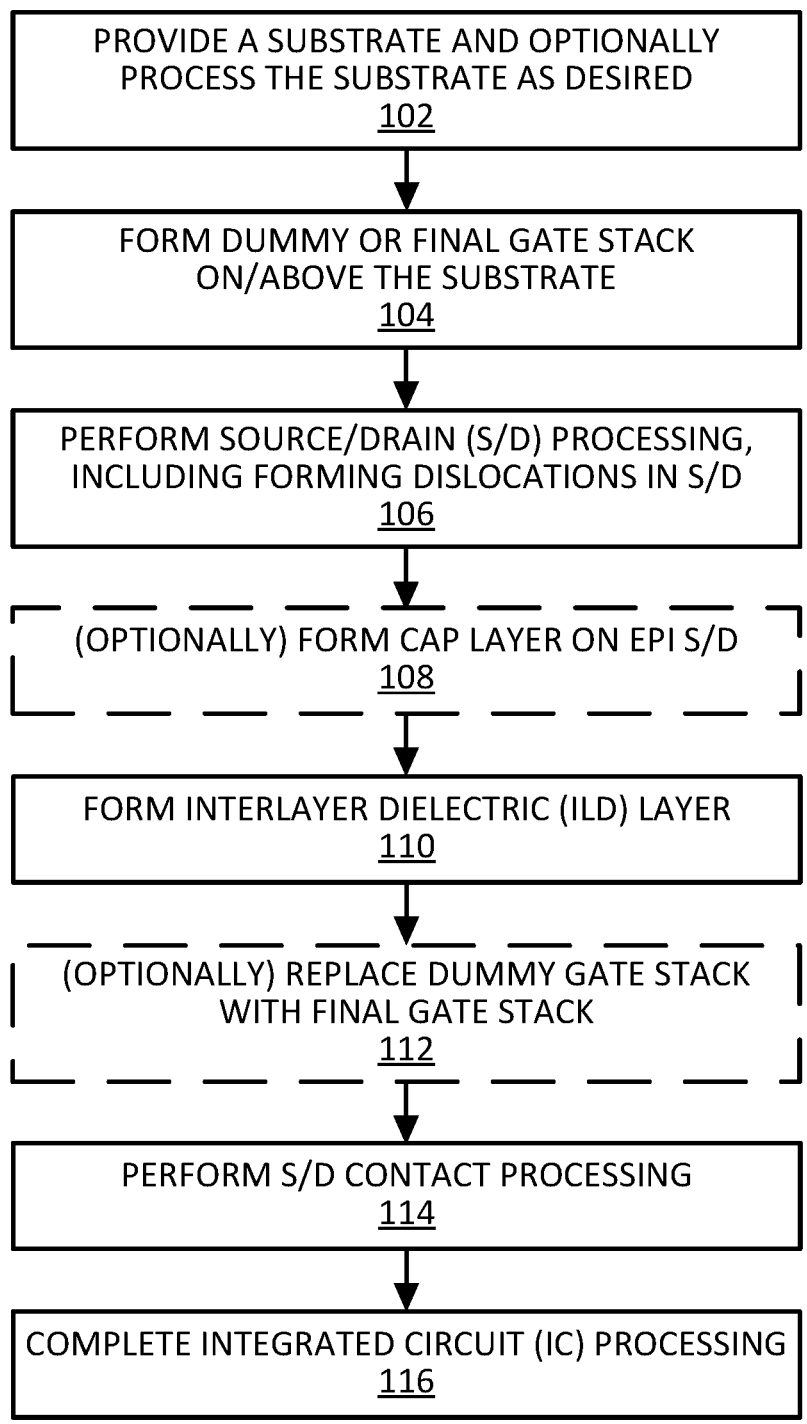
FIG. 1 illustrates a method of increasing channel region tensile strain in n-MOS devices, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

In n-channel metal-oxide-semiconductor field-effect transistor (n-MOS or NMOS) devices, introducing tensile to the channel region is desired to increase/improve the mobility of carriers (specifically, electrons, as it is an n-channel device). At smaller scaled dimensions, it is difficult to introduce tensile strain into the channel region of n-MOS devices. Attempting to introduce tensile strain to the channel region of an n-MOS device by, for example, forming a metal gate via a sputtering process (e.g., to cause the metal gate to contract) is not practical for small spaces such as gate trenches. For instance, using a sputtering process for metal gate deposition would result in voids in the gate trench, thereby undesirably degrading transistor performance. Other processes used for the metal gate deposition at scaled dimensions include chemical vapor deposition (CVD) processes. However these other non-sputtering gate forming processes do not cause the metal gate to contract, and thus, do not increase tensile strain in the channel region. Attempting to introduce tensile strain to the channel region of an n-MOS device by using, for example, a nitride etch stop layer (NESL) above the channel region and source/drain (S/D) regions to generate strain in the underlying transistor would also incur issues. Such issues include, for instance, that the overall thickness of an included NESL would be relatively much thinner or otherwise negligible compared to the thickness of the S/D regions, thereby making the impact of such a NESL much less than what can be achieved via relatively much thicker S/D regions. Further making the NESL thicker would reduce the area available for S/D contacts, thereby leading to undesired degradation in the device performance. Moreover, all of the aforementioned issues are exacerbated by increased scaling.

Thus, and in accordance with one or more embodiments of the present disclosure, techniques are provided for increasing channel region tensile strain in n-MOS devices. In some embodiments, increased channel region tensile strain can be achieved via S/D material engineering that deliberately introduces dislocations in one or both of the S/D regions to produce tensile strain in the adjacent channel region. In some such embodiments, the S/D material engineering to create desired dislocations may include using a lattice mismatched epitaxial S/D film adjacent to the channel region. For instance, in an example embodiment, epitaxial silicon germanium (SiGe) can be formed on a Si substrate to create such deliberate dislocations. Typically, epitaxial SiGe formed on a Si substrate would cause compressive strain in an adjacent channel region, which is why SiGe S/D is used for p-MOS applications (as the channel region compressive strain would be desired). However, such situations include epitaxial SiGe S/D material with a relatively low amount of Ge content. If, instead, epitaxial SiGe material with greater Ge concentration is used (e.g., SiGe with greater than 30 percent Ge content), then beyond the critical thickness of the material used (which is achieved in the S/D regions), the SiGe material causes a relatively high lattice mismatch with the adjacent Si substrate, forming dislocations in the SiGe material. If a threshold amount of dislocations are introduced in the SiGe S/D material, such as 2 or more dislocations for a single S/D region (e.g., 2, 3, 4, 5, or more dislocations), then the strain provided to the adjacent channel becomes tensile instead of compressive. Numerous material schemes for achieving multiple dislocations in one or both S/D regions to increase the tensile strain in the adjacent channel region will be apparent in light of this disclosure.

In some embodiments, the techniques may be employed using group IV semiconductor material applications, while in other embodiments, the techniques may be employed using group III-V semiconductor material applications, as will be apparent in light of this disclosure. The use of "group IV semiconductor material" (or "group IV material" or generally, "IV") herein includes at least one group IV element (e.g., silicon, germanium, carbon, tin, lead), such as Si, Ge, SiGe, silicon carbide (SiC), and so forth. The use of "group III-V semiconductor material" (or "group III-V material" or generally, "III-V") herein includes at least one group III element (e.g., aluminum, gallium, indium, boron, thallium) and at least one group V element (e.g., nitrogen, phosphorus, arsenic, antimony, bismuth), such as gallium arsenide (GaAs), indium gallium arsenide (InGaAs), gallium phosphide (GaP), gallium antimonide (GaSb), and indium phosphide (InP), and so forth. In some embodiments, to form a desired amount of dislocations in an S/D region (and thus, cause tensile strain in the adjacent channel region), the channel region and S/D region material may be selected such that there is in excess of 2 percent lattice mismatch between the two materials, as will be described in more detail herein. As can be understood based on this disclosure, the channel region may include similar material as the substrate; however, the present disclosure is not intended to be so limited. For example, in some embodiments, the channel region may be formed from replacement material, such as via a replacement fin process (e.g., using an aspect ratio trapping (ART) scheme). Therefore, in some embodiments, the relevant channel region material for the lattice mismatch with the epitaxial S/D material may be the channel region material present at the time of the formation of that epi S/D material. In some embodiments, the techniques may cause an increase in the channel region tensile strain in the range of 0.1-1.5 percent (e.g., 0.2-1 percent), or some other suitable amount as will be apparent in light of this disclosure.

In some embodiments, the epitaxial S/D region material (that includes dislocations to cause strain to the adjacent channel region) may also include high Schottky contact resistance, which would degrade the overall device current and switching performance. Therefore, in some embodiments, an upper portion of the one or both of the S/D regions may be modified to reduce contact resistance prior to depositing the S/D contacts. For instance, in some such embodiments, a cap layer may be formed on top of the main epitaxial S/D material prior to depositing the S/D contacts, where the cap layer includes different material than the main epitaxial S/D material and/or relatively higher levels of doping to improve the S/D contact resistance. In some such embodiments, the cap layer may be a distinct layer or a graded transition of materials near the upper portion of the S/D region, so long as the contact resistance reducing material is employed at/near the interface between the S/D and corresponding contact. Note that in some embodiments, the techniques described herein may introduce tensile strain in the channel region in a first instance, such that no tensile strain would be present in the channel region without use of the techniques variously described herein. Further, in some such embodiments, there may even be initial compressive strain in the channel region, such as from the weight of the overlying gate/gate stack, for example. However, in other embodiments, there may initially be some amount of tensile strain in the channel region for various regions, such that the techniques described herein increase that initial tensile strain. Regardless of the initial strain in the channel region, the techniques can be used to increase the tensile strain in the channel region, which, in some cases, may equate to a decrease in the compressive strain in the channel region, for example. Therefore, in some embodiments, transistors formed using the techniques described herein need not include tensile strain in the channel region, but instead may include reduced compressive strain, as can be understood based on this disclosure.

The techniques described herein can be used to benefit many different transistor configurations and types. For instance, the techniques can benefit transistors including planar or non-planar configurations, in accordance with some embodiments. In embodiments where non-planar transistor configurations are employed, the configurations may include finned (e.g., FinFET, tri-gate, and/or double-gate) configurations and/or nanowire (or nanoribbon or GAA) configurations, as will be apparent in light of this disclosure. Recall that in embodiments where the transistor device being formed includes an n-MOS device, the techniques for increasing channel region tensile strain can improve the carrier (specifically, electron) mobility of that n-MOS, for example. For instance, in some embodiments, the techniques may provide an approximately 13 percent n-MOS transistor performance gain at matched leakage. However, the techniques can also be used to benefit other transistor device types, such as tunnel FET (TFET) devices, which typically have a p-i-n (p-type, intrinsic, n-type) doping scheme, in accordance with some embodiments. An example benefit for such a TFET device can include introducing dislocations into the n-type S/D region to lower the resistance on the tunnel side of the device, thereby improving device performance. Thus, as can be understood based on this disclosure, in some embodiments, the techniques may be performed to introduce dislocations into only one S/D region of a transistor device and need not introduce the dislocations into both S/D regions in every implementation (regardless of the source/channel/drain doping scheme). Further, the techniques may be used to benefit the n-channel portions of transistor devices including other, non-n-channel transistors, such as a complementary MOS (CMOS) device that typically includes at least one p-MOS and at least one n-MOS device, or other transistor-based devices, as will be apparent in light of this disclosure.

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit including a transistor, the transistor having a channel region that includes tensile strain and/or the transistor having at least one epitaxial S/D region including dislocations, as variously described herein. For instance, in some such embodiments the tensile strain in the channel region (e.g., the average tensile strain in the channel region) can be detected/measured using any suitable techniques, such as using NBD or NBED, to measure the strain in the crystalline material to determine the presence and/or amount of tensile strain. Further, in some such embodiments, dislocations in the epi S/D may be detected/measured using any suitable techniques, such as using various electron microscopy techniques, to determine the presence and/or amount of dislocations in a given S/D region, for example. In some embodiments, the techniques and IC structures formed may be detected based on the material scheme used, where the materials of an S/D region and the corresponding adjacent channel region may be deliberately selected based on there being a lattice mismatch between the materials of the two regions. In some such embodiments, electron microscopy and spectroscopy may be used to detect and determine the different regions and the material included in each region, and then it can be determined whether a lattice mismatch would occur between the two materials, for example. In some embodiments, use of the techniques and IC structures variously described herein may be detected based on the benefits derived from their use, such as the carrier mobility benefits derived for n-MOS devices, to name an example benefit. Numerous configurations and variations will be apparent in light of this disclosure.

Methodology and Architecture

Figure 2A:
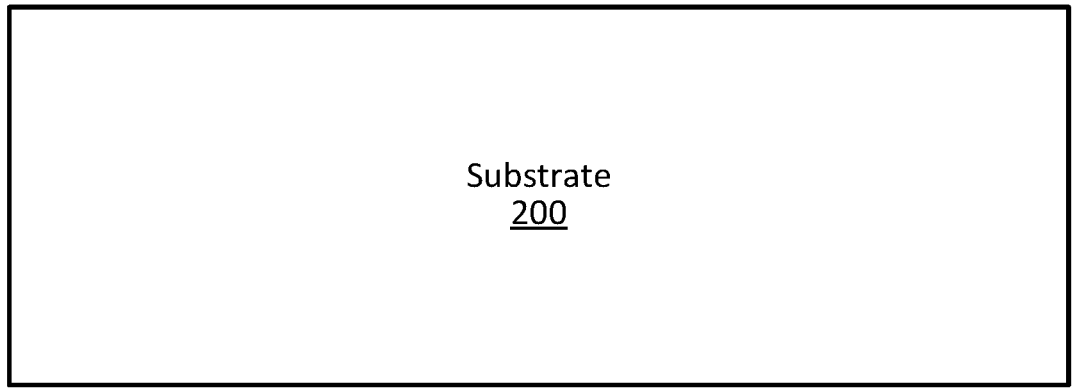

FIG. 1 illustrates a method 100 of increasing channel region tensile strain in n-MOS devices, in accordance with some embodiments of the present disclosure. FIGS. 2A-G illustrate example integrated circuit structures (IC) that are formed when carrying out method 100 of FIG. 1, in accordance with some embodiments of the present disclosure. FIGS. 2C', 2D', and 2G' illustrate the example structures of FIGS. 2C, 2D, and 2G, respectively, including example variations that may be employed for the method 100 of FIG. 1, in accordance with some embodiments of the present disclosure. Note that FIGS. 2A-G, 2C', 2D', and 2G' are all cross-sectional IC views across both S/D regions to adequately illustrate example structures being formed during the performance of method 100. Also note that FIGS. 2A-G may be depicting a planar transistor architecture or a finned structure to be used for a non-planar transistor architecture (e.g., a transistor including a finned, tri-gate, double-gate, FinFET, nanowire, nanoribbon, and/or gate-all-around (GAA) configuration). Therefore, the techniques described herein can be used to form transistors including a multitude of geometries and configurations, as can be understood based on this disclosure. For example, FIG. 3 illustrates an example integrated circuit structure including transistors having finned and nanowire configurations, as will be described in more detail below. As will be apparent in light of this disclosure, in some embodiments, tensile strain can be increased in an n-channel region by forming one or both of the adjacent S/D regions with dislocations that cause the tensile strain on the channel region. This can be achieved, in some embodiments, via material engineering, such as employing S/D material that is lattice mismatched with the channel region material so that dislocations are formed in the S/D material, as will be apparent in light of this disclosure. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Method 100 of FIG. 1 includes providing 102 a substrate and optionally processing the substrate as desired, in accordance with some embodiments. Example substrate 200 is shown in FIG. 2A. In some embodiments, such optional processing may include forming one or more fins from the substrate (native fins), which may be formed via a shallow trench recess (STR) etch process and/or other suitable processing. Such optional processing may also include performing shallow trench isolation (STI) processing, which may include forming recesses in the substrate (e.g., via STR processing), depositing STI material, and optionally planarizing/polishing the structure. In some such cases, the STI material may include any suitable electrically insulating material, such as any suitable dielectric, oxide, and/or nitride, for example. Further, in some such cases, the STI material may be selected based on the material of the underlying substrate. If the optional processing includes both forming fins and STI processing, additional processing may include forming replacement fins by removing the native fins formed thereby forming fin-shaped trenches between the STI material and depositing material in the fin trenches to form replacement fins. Such replacement fins may include a single material layer or multiple material layers. For instance, multilayer replacement fins may be formed to allow for subsequent processing into nanowires (or nanoribbons) for a GAA transistor and/or to assist with sub-channel/sub-fin isolation. Note that fins may be formed to achieve various non-planar transistor configurations, such as a FinFET configuration (e.g., tri-gate or double-gate) or nanowire (or nanoribbon or GAA) configuration, for example. Further note that the substrate 200 shown in FIG. 2A may be a cross-sectional view of such a fin, where the subsequent processing of method 100 is performed on that fin (e.g., whether the fin is a native fin to underlying material or a replacement material fin), as can be understood based on this disclosure. Numerous other suitable optional processing to the substrate may be performed as desired prior to continuing to box 102, depending on the end use or target application.

Substrate 200, in some embodiments, may include: a bulk substrate including group IV semiconductor material, such as silicon (Si), germanium (Ge), silicon germanium (SiGe), or silicon carbide (SiC), and/or at least one group III-V material and/or any other suitable material(s) as will be apparent in light of this disclosure; an X on insulator (XOI) structure where X is one of the aforementioned materials (e.g., group IV and/or group III-V) and the insulator material is an oxide material or dielectric material or some other electrically insulating material; or some other suitable multilayer structure where the top layer includes one of the aforementioned materials (e.g., group IV and/or group III-V). The use of "group IV semiconductor material" (or "group IV material" or generally, "IV") herein includes at least one group IV element (e.g., silicon, germanium, carbon, tin, lead), such as Si, Ge, SiGe, SiC, and so forth. The use of "group III-V semiconductor material" (or "group III-V material" or generally, "III-V") herein includes at least one group III element (e.g., aluminum, gallium, indium, boron, thallium) and at least one group V element (e.g., nitrogen, phosphorus, arsenic, antimony, bismuth), such as gallium arsenide (GaAs), indium gallium arsenide (InGaAs), gallium phosphide (GaP), gallium antimonide (GaSb), and indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

In some embodiments, substrate 200 may include a surface crystalline orientation described by a Miller Index of <100>, <110>, or <111>, as will be apparent in light of this disclosure. In some embodiments, substrate 200 may have a thickness (dimension in the Y-axis direction) in the range of 50 to 950 microns, for example, or any other suitable thickness as will be apparent in light of this disclosure. In embodiments where substrate 200 is not the base layer of the IC being formed (e.g., if it a pseudo-substrate used to assist with the transistor fabrication), it may have a relatively smaller thickness than the base die/wafer above which it was formed, where that base die/wafer may have a thickness as described in the preceding sentence (e.g., 50-950 microns). For instance, in the case where substrate 200 is the top layer formed on a base bulk wafer (e.g., a base bulk Si wafer), then such a substrate layer may have a thickness in the range of 50 nm to 2 microns, for example, or any other suitable thickness as will be apparent in light of this disclosure. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the structures described herein may be included in a system-on-chip (SoC) application, as will be apparent in light of this disclosure.

Figure 2B:
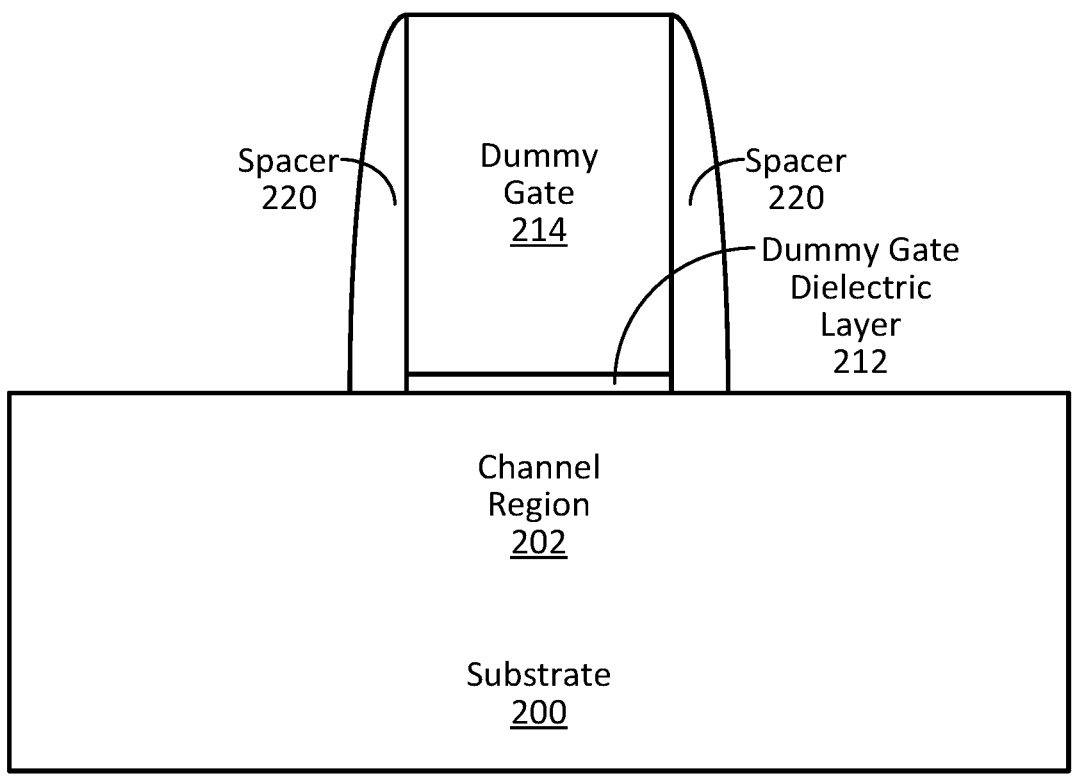
Figure 3:
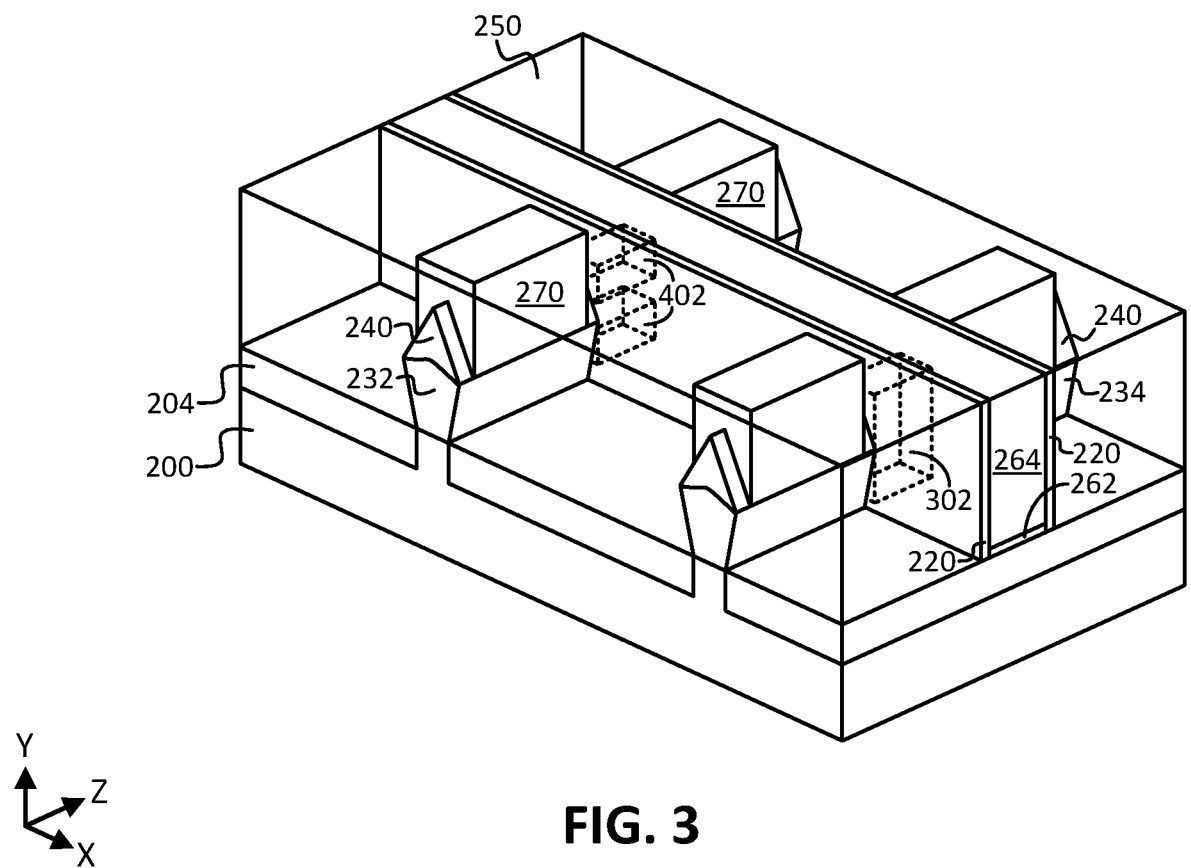
FIG. 3 illustrates a perspective view of an example IC structure, illustrating non-planar transistor configurations formed using the method of FIG. 1, in accordance with some embodiments of the present disclosure.

Method 100 of FIG. 1 continues with forming 104 a dummy gate stack or final gate stack on/above substrate 200 to form the resulting example IC structure of FIG. 2B, in accordance with some embodiments. In this example embodiment, dummy gate dielectric layer 212 and dummy gate 214 include sacrificial material (e.g., dummy polysilicon for the gate 214) to be later removed and replaced in a replacement gate process in, for example, a gate last process flow. However, in some embodiments, the process flow may include a gate first process flow (also called an up-front hi-k gate flow), whereby the final gate structure is formed at this stage instead of a dummy gate. Use of a dummy gate can allow for subsequent processing in the channel region 202, such as to form one or more nanowires as will be described in more detail below; however, use of such a dummy gate and a gate last process flow need not be required, such as in the fabrication of finned and planar transistors, for example. In some embodiments, formation of the dummy gate stack may be performed using any suitable techniques, such as depositing the dummy gate dielectric layer 212 and dummy gate (also referred to as dummy gate electrode) 214, patterning the dummy layers 212 and 214 into a dummy gate stack, depositing gate spacer material, and performing a spacer etch to form spacers 220 on either side of the dummy gate stack, shown in FIG. 2B, for example. Spacers 220 (also referred to as gate spacers or sidewall spacers) can help determine the channel length and can also help with replacement gate processes, for example. As can be understood based on this disclosure, the dummy gate stack (and spacers 220) help define the channel region 202 and source/drain (S/D) regions, where the channel region 202 is below the dummy gate stack (as it will be located below the final gate stack), and the S/D regions are adjacent to the channel region 202, on either side of channel region 202. Spacers 220 may include any suitable material, such as any suitable electrical insulator, dielectric, oxide (e.g., silicon oxide), and/or nitride (e.g., silicon nitride) material, as will be apparent in light of this disclosure. Recall that, the techniques described herein need not include forming a dummy gate stack, such that a final gate stack may be formed in the first instance. In some embodiments, the dummy gate stack may also include a hardmask layer over the dummy gate, which may be included to protect the dummy gate stack during subsequent processing, for example.

Method 100 of FIG. 1 continues with performing 106 source/drain (S/D) processing, including forming dislocations in at least one of the S/D regions, in accordance with some embodiments. In some embodiments, any suitable techniques for performing 106 S/D processing, such as etching to remove material from substrate 200 (or to remove portions of a fin formed as previously described, in the case of a finned architecture) and epitaxially depositing/growing (or otherwise forming) the material of the S/D regions. In some embodiments, such an epitaxial deposition process may include metal-organic chemical vapor deposition (MOCVD), molecular-beam epitaxy (MBE), chemical vapor deposition (CVD), atomic layer deposition (ALD), physical vapor deposition (PVD), and/or any other suitable process as will be apparent in light of this disclosure. In the example embodiment of FIG. 2C, S/D regions 232/234 were formed as shown, where each S/D region includes dislocations 235. Note that the designation of S/D and 232/234 need not denote that region 232 is the source region and region 234 is the drain region, as either of 232 and 234 could be used as the source region while the other would then be used as the drain region, as can be understood based on this disclosure. In the example embodiment of FIG. 2C', only S/D region 234 includes dislocations 235, as shown, such that S/D region 232' does not include dislocations, thereby causing asymmetrical strain on channel region 202. Such a configuration may be used in, for instance, a TFET device where the device may include a p-i-n doping scheme, such that S/D region 232' is p-type doped and does not include dislocations, the channel region is intrinsic (or nominally undoped, with doping concentrations of less than 5E17 atoms per cubic cm of either type, for example), and S/D region 234 is n-type doped and includes dislocations 235 as shown, to provide an example.

Dislocations 235 may be formed in one or both of the S/D regions 232/234 as a result of the lattice mismatch between the material included in the S/D regions 232/234 and the material included in the channel region 202. In more detail, if monocrystalline material 1 and monocrystalline material 2 are said to be lattice matched to one another, this means that the lattice parameters of material 1 and material 2 are equal within 2 percent (i.e., +/−2%), even when those materials are grown above their respective critical thicknesses. Such lattice matched materials generally do not produce dislocations at the interface between the two monocrystalline materials; rather, there is lattice continuity across that entire interface. Conversely, if monocrystalline material 1 and monocrystalline material 2 are said to be lattice mismatched to one another, this means that the lattice parameters of material 1 and material 2 are different than more than 2 percent, and multiple dislocations will result. As used here, the term "lattice parameter" refers to the distance between rows of atoms or spacing between rows of atoms in a given crystallographic direction of a monocrystalline material. The monocrystalline (epitaxial or single crystal) material may be elemental or a compound or alloy. The distance or spacing between rows of atoms can vary as a function of the alloy concentrations or phase of a given monocrystalline compound. So, the types and quantity of each of the atoms used in a given monocrystalline material will dictate the lattice parameter and crystal structure. For elemental monocrystalline materials, the lattice parameter can be measured, for example, to be the average distance between adjacent planes of atoms (as measured from center of nuclei) of the monocrystalline material in a given crystallographic direction. For compound and alloy monocrystalline materials, the lattice parameter can similarly be measured as the average distance between adjacent planes of atoms of the compound or alloy monocrystalline material. So, as used herein, if material included in the at least one S/D region is said to have a lattice mismatch of greater than 2 percent with respect to material included in the channel region, that is sufficient to cause dislocations 235, according to an embodiment. The greater the mismatch percentage, the greater the number of dislocations at the interface, according to still further embodiments.

In some embodiments, multiple dislocations 235 may be formed in at least one S/D region 232/234, such as at least 2, 3, 4, 5, 6, 7, 8, 9, 10, or more dislocations per single S/D region, or any other suitable minimum threshold amount of dislocations. In some such embodiments, the dislocations 235 may be formed to cause tensile strain 205 in channel region 202; although, tensile strain may be caused due to other techniques, as can be understood based on this disclosure. In some embodiments, the dislocations 235 may be formed due to the lattice mismatch between material included in the channel region 202 and material included in the S/D regions 232/234, as will be described in more detail below. In some such embodiments, the lattice mismatch between the materials is greater than 2 percent, and in some example cases may be at least 2.5, 3, 3.5, or 4 percent, for example, or some other suitable minimum threshold amount as will be apparent in light of this disclosure. Further, in some such embodiments, the lattice mismatch may be in the range of approximately 2.5 to approximately 4.2 percent, depending on the channel region 202 and S/D region 232/234 materials and configuration employed. Note that although the dislocations 235 formed in the S/D regions are shown near channel region 202 (e.g., near the S/D-channel interface), dislocations 235 may be formed in any portion of the S/D regions 232/234 and still cause tensile strain to the adjacent channel region 202, in some embodiments. Therefore, the present disclosure is not intended to be limited to just the locations of the dislocations 235 shown in FIG. 2C (e.g., not limited to just having included dislocations near the S/D-channel interface). In some embodiments, the average tensile strain in channel region 202 (e.g., where the averaging is performed in that active channel region) may be at least 0.1, 0.2, 0.25, 0.5, 0.75, 1, 1.25, or 1.5 percent, for example, or some other suitable minimum threshold amount as will be apparent in light of this disclosure. In some embodiments, the average tensile strain in channel region 202 may be in the range of 0.1 to 1.5 percent (e.g., 0.2 to 1 percent), depending on the channel region 202 and S/D region 232/234 materials and configuration employed.

As shown in FIG. 2C, the dislocations 235 in each of the S/D regions 232/234 are approximately symmetrical, such that the corresponding tensile strain 203/205 caused in channel region 202 is also approximately symmetrical, in this example embodiment. This may be achieved by processing both sides of the channel region 202 in a similar manner, such that S/D region 232 is approximately equivalent to S/D region 234 in terms of material, doping scheme, and configuration. However, the present disclosure is not intended to be so limited. In other embodiments, the tensile strain in the channel region imposed by adjacent S/D regions may be asymmetrical, such that the channel region is pulled toward one S/D region more than the other and/or the tensile strain is not evenly distributed throughout the channel region. For instance, in the example embodiment of FIG. 2C', recall that S/D region 232' does not include dislocations, such that it does not increase the tensile strain on adjacent channel region 202 in a manner that S/D region 234 does (due to the dislocations 235 formed in S/D region 234). In such an example embodiment, the tensile strain 205 is only actively applied by one side of the channel region 202 (the side closest to S/D region 234), as shown. Therefore, whether or not tensile strain is increased in the channel region by only one or both of the adjacent S/D regions, the tensile strain caused need not be applied in an equivalent manner, such that the tensile strain throughout the channel region need not be approximately symmetrical in nature, in accordance with some embodiments. In some such embodiments, the tensile strain may be at least 5, 10, 15, 20, 25, 50, or 75 percent greater, for example, on one side of the channel region (e.g., the side closest to the S/D region with the most dislocations and/or having material that causes the largest lattice mismatch) than the other, or some other suitable relative minimum threshold amount as will be apparent in light of this disclosure.

In some embodiments, S/D regions 232/234 (and 232') and channel region 202 may include any suitable materials as will be apparent in light of this disclosure. For instance, in some embodiments, S/D regions 232/234 and channel region 202 may include group IV semiconductor material and/or group III-V semiconductor material, including any suitable doping scheme (such that one or more of the regions are nominally undoped or intrinsic and/or one or more of the regions are doped n-type and/or p-type). In some embodiments, the channel region and at least one of the adjacent S/D regions (or both of the adjacent S/D regions) may include group IV semiconductor material. For instance, in some embodiments, the channel region may include Si and at least one adjacent S/D region may include Ge and/or SiGe that has a Ge concentration of at least 30, 40, 50, 60, 70, 80, or 90 percent (e.g., $Si_{1-x}Ge_x$, where x is at least 0.3, 0.4, 0.5, 0.6, 0.7, 0.8, or 0.9 respectively), for example, or some other suitable minimum threshold atomic percent of the total SiGe compound as will be apparent in light of this disclosure. Generally, in some embodiments, the material included in an S/D region may include at least 30, 40, 50, 60, 70, 80, or 90 more Ge concentration than the material included in its adjacent channel region, for example, or some other suitable minimum relative threshold percent as will be apparent in light of this disclosure. For instance, in some such embodiments the channel region may include Si, SiGe, and/or germanium tin (GeSn), to name some examples, while one or both of the adjacent S/D regions may include Ge, SiGe, and/or GeSn, to name some examples, with relatively higher Ge concentration compared to the material included in the channel region. Numerous variations of group IV semiconductor material pairings between the material of the channel region and the material of at least one adjacent S/D region (or both adjacent S/D regions) will be apparent in light of this disclosure.

In some embodiments, the channel region and at least one of the adjacent S/D regions (or both of the adjacent S/D regions) may include group III-V semiconductor material. For instance, in some embodiments, the channel region may include indium gallium arsenide (InGaAs) and at least one adjacent S/D region may include indium arsenide (InAs), to provide an example. In some such embodiments, the channel region may include InGaAs with approximately 53 percent In content in the InGaAs compound, and the channel region may include InAs with approximately 80 percent In content in the InAs compound, such that there is a difference of at least approximately 27 percent greater In content in the S/D region relative to the channel region to give a lattice mismatch of at least approximately greater than 2 percent. Generally, in some embodiments, the material included in an S/D region may include at least 25, 30, 35, 40, 45, or 50 percent more In concentration than the material included in its adjacent channel region, for example, or some other suitable minimum relative threshold percent as will be apparent in light of this disclosure. For instance, in some such embodiments the channel region may include InGaAs, InAs, indium gallium antimonide (InGaSb), indium antimonide (InSb), and/or indium arsenide antimonide (InAsSb), to name some examples, while one or both of the adjacent S/D regions may include InGaAs, InAs, InGaSb, InSb, and/or InAsSb, to name some examples, with relatively higher In concentration compared to the material included in the channel region. Numerous variations of group III-V semiconductor material pairings between the material of the channel region and the material of at least one adjacent S/D region (or both adjacent S/D regions) will be apparent in light of this disclosure. In some embodiments, a combination of group IV and group III-V semiconductor materials may be used in the channel and S/D regions to, for example, increase the lattice mismatch between the material of the regions to form dislocations in at least one S/D region and increase tensile strain in the channel region, as can be understood based on this disclosure.

In some embodiments, the channel region 202 may include any suitable doping scheme, such as being n-type doped and/or p-type doped with any suitable dopants and at any suitable concentration, or being intrinsic or nominally undoped (e.g., with doping concentrations of less than 5E17 atoms per cubic cm of either type). In some embodiments, S/D regions 232/234 (and 232') may include any suitable doping scheme, such as being n-type doped and/or p-type doped with any suitable dopants and at any suitable concentration (such as having an impurity dopant concentration of at least 1E16, 1E17, 1E18, 1E19, 1E20, or 1E21 atoms per cubic cm, for example). For instance, in the case of an n-MOS device, the device may include an n-p-n source-channel-drain doping scheme. Further, in the case of a TFET device, the device may include a p-i-n or n-i-p source-channel-drain doping scheme. However, the techniques may be applied to any transistor-based device that includes at least one n-type doped S/D region, where the n-type doped S/D region includes multiple dislocations to increase tensile strain in an adjacent channel region, in accordance with some embodiments. For instance, in the case of group IV semiconductor materials, suitable n-type dopants include phosphorus (P) and arsenic (As), just to name a few suitable example dopants of one type for example material. To provide another example, Si can be used as a suitable n-type dopant for group III-V semiconductor materials. In some embodiments, the S/D regions 232/234 (and 232') and/or channel region 202 may include a multilayer structure including multiple material layers, for example. In some embodiments, the S/D regions 232/234 (and 232') and/or channel region 202 may include grading (e.g., increasing and/or decreasing) the concentration of at least one material throughout at least a portion of the feature(s), for example.

FIG. 2C" is a blown out view showing a portion of FIG. 2C' to illustrate that the S/D regions as variously described herein may at least partially extend under spacers 220, in accordance with some embodiments. For instance, as shown in FIG. 2C", S/D region 232" extends all the way under spacer 220, such that it extends to the interface of the channel region 202 and dummy gate stack (including dummy gate electrode 212 and dummy gate 214). In such embodiments where an S/D region extends under the corresponding spacer, the portion that extends under may be referred to as an S/D or epi extension or tip, for example. In some embodiments, an S/D region including a tip portion may be formed by performing an undercut etch when forming the S/D region, where the undercut etch removes material under the spacer prior to epitaxially forming the S/D material. Note that in FIGS. 2C, 2C', and 2C", the S/D regions are directly adjacent with the corresponding channel region, such that they are in physical contact with the channel region. However, in some embodiments, one or more layers may be formed between the main epitaxial portion of the S/D regions (e.g., the portion that is the largest in the S/D regions) and the adjacent channel region, such that the main epi portion of that S/D region is not directly adjacent to the channel region. In other words, the use of adjacent to describe the relationship between an S/D region and a channel region, as used herein, need not denote that the two regions are directly adjacent such that they are in physical contact, and can include one or more intervening layers between the adjacent regions, in accordance with some embodiments. Numerous variations and configurations to the S/D regions of transistor devices formed using the techniques described herein will be apparent in light of this disclosure.

Method 100 of FIG. 1 optionally continues with forming 108 a cap layer on the epitaxial S/D material, in accordance with some embodiments. For instance, in the example embodiment of FIG. 2D (which continues from FIG. 2C), cap layer 240 is shown formed above (and/or over and/or on) both S/D regions 232 and 234. In some embodiments, cap layer 240 may be formed on/above one or both of the S/D regions to reduce contact resistance with the S/D contact(s) (which typically includes metal or a metal alloy). Thus, in some instances, cap layer 240 may be referred to herein as an intervening layer, as it can be formed between an S/D region and the corresponding S/D contact. In some embodiments, the contact resistance reduction benefit may be desired as a result of the material used for the epitaxial S/D, the amount of doping in the epi S/D, and/or the presence of dislocations in the epi S/D, for instance. In the example embodiment of FIG. 2D' (which continues from FIG. 2C'), cap layer 240 is formed above/over/on only one S/D region, specifically, over S/D region 234 as shown. Thus, such a cap layer 240, where included, need not be formed above/over/on each S/D region, in accordance with some embodiments. Recall that in the example structure of FIG. 2D', S/D region 234 includes dislocations 235 while S/D region 232' does not, which may be why cap layer 240 would be particularly beneficial for S/D region 234 (because of the dislocations present in that S/D region). In some embodiments, cap layer 240 may be formed using any suitable techniques, such as masking the dummy gate stack region (and optionally masking one of the S/D regions, where only the other S/D region is to be processed) and depositing the cap layer 240 using any suitable process (e.g., MOCVD, MBE, CVD, ALD, PVD), for example.

In some embodiments, cap layer 240 may include any suitable material, such as material that assists with reducing contact resistance for the S/D regions, for example. In some embodiments, cap layer 240 may include group IV and/or group III-V semiconductor material, including any suitable doping scheme, for example. In some embodiments, cap layer 240 may include different material and/or levels of doping relative to the corresponding underlying S/D region. For instance, in example embodiments where an S/D region (e.g., S/D region 234) includes SiGe, the corresponding cap layer may include Si (and thus not include Ge), for example, and/or include relatively high levels of doping, such as doping concentrations of at least 1E18, 1E19, 1E20, 1E21, or 5E21 atoms per cubic cm, for example, or some other suitable minimum threshold amount as will be apparent in light of this disclosure. In example embodiments where an S/D region (e.g., S/D region 234) includes InAs, the corresponding cap layer may include InGaAs (and thus also include Ga), for example, and/or include relatively high levels of doping, such as doping concentrations of at least 1E18, 1E19, 1E20, 1E21, or 5E21 atoms per cubic cm, for example, or some other suitable minimum threshold amount as will be apparent in light of this disclosure. In some embodiments, the cap layer will be doped the same type as the underlying S/D region (e.g., where both the cap layer and underlying S/D region are n-type doped at the same or different concentration levels, for instance).

Recall that cap layer 240 is optional, and thus it need not be present above/over/on either of the S/D regions of a transistor in some embodiments. In some embodiments, in addition to or in place of the cap layer 240, one or both of the S/D regions may include increased different material and/or increased doping levels in an upper portion of the S/D region(s), such as in the portion nearest where contact will occur. In some such embodiments, the different material and/or increased doping levels may be achieved via a grading scheme, wherein a new material may be graded in or out of the S/D region as the S/D region material is being deposited (or otherwise formed) and/or additional dopants may be graded in (or otherwise introduced, e.g., via ion implantation) near the upper portion of the S/D region. In this manner, such techniques may achieve a contact resistance reducing benefit in a similar manner as the cap layer achieves such benefits. In a more general sense, numerous S/D structures can be used, including multilayer structures (e.g., bi-layer construction having main S/D region and cap layer) or a single continuous S/D layer having one or more graded components, as can be understood based on this disclosure.

Figure 2D:
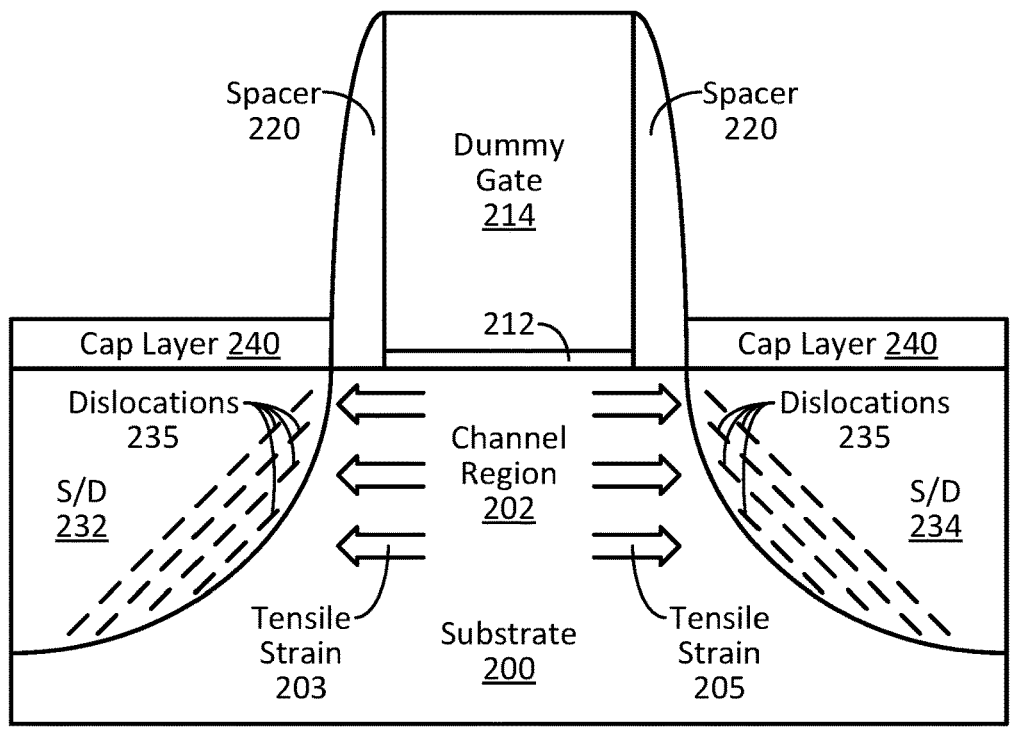
Figure 2D:
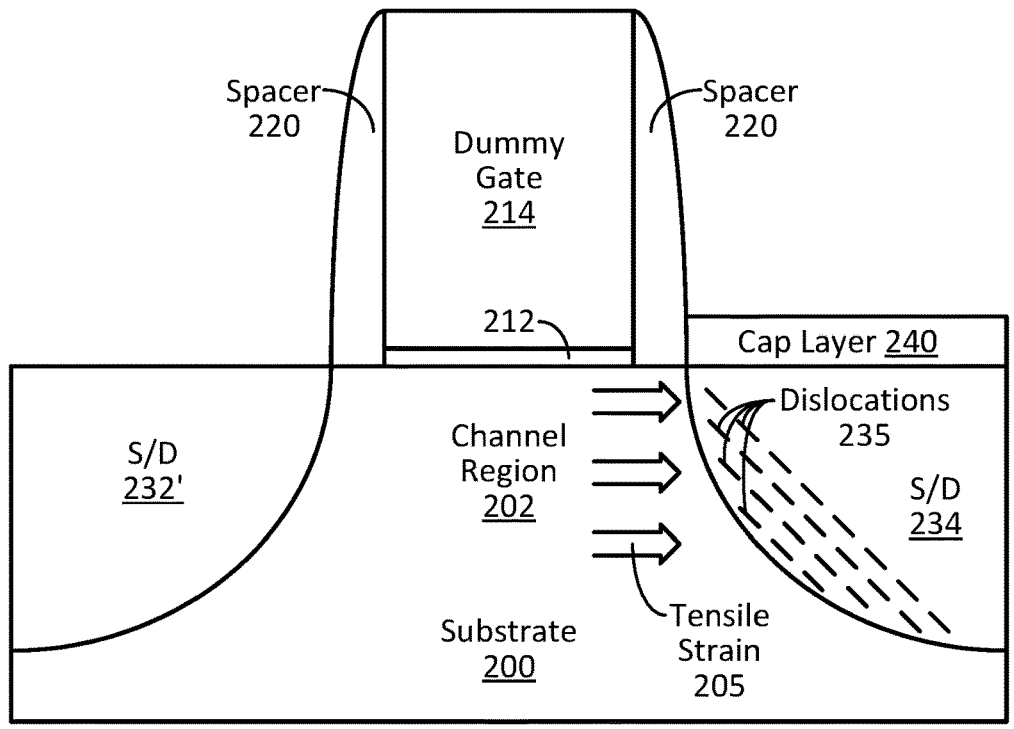
Figure 2E:
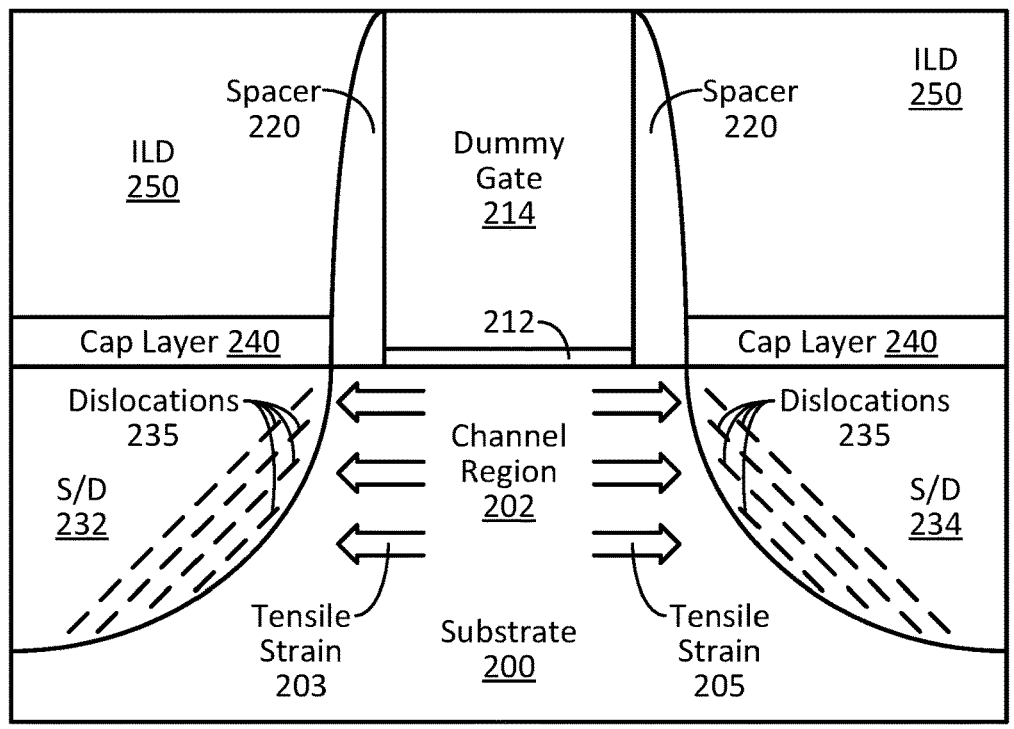
Figure 2F:
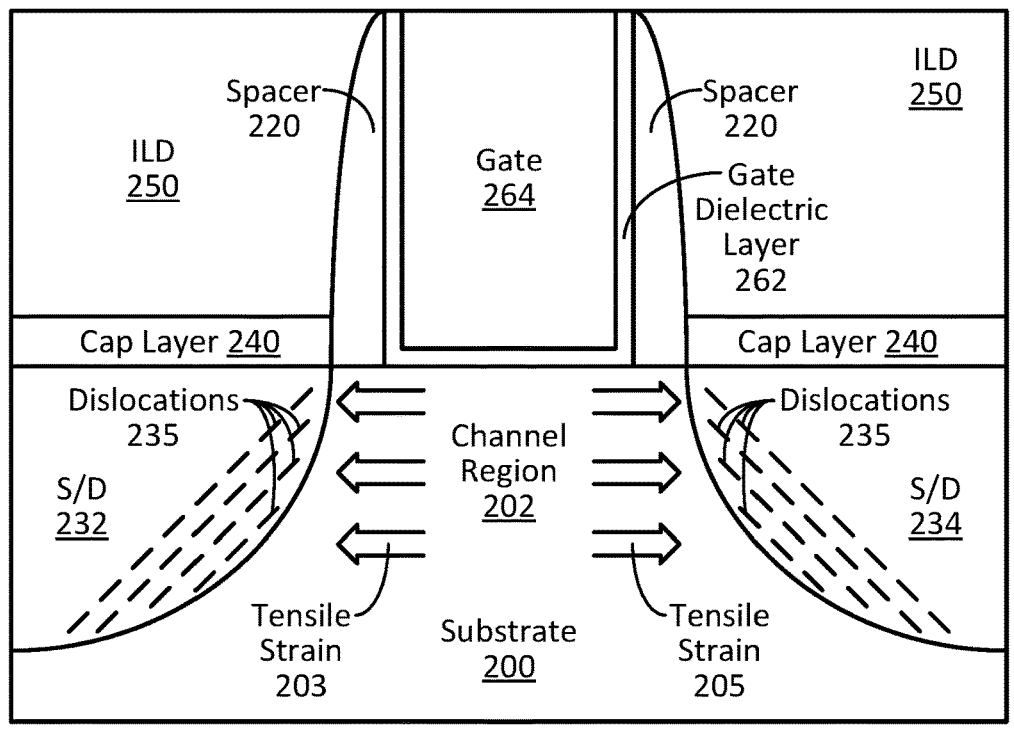

Method 100 of FIG. 1 continues with forming 110 an interlayer dielectric (ILD) layer 250 on the structure of FIG. 2D to form the example resulting structure of FIG. 2E, in accordance with an embodiment. In some embodiments, ILD layer 250 may be formed using any suitable techniques, such as depositing the ILD layer 250 material on the structure of FIG. 2D and planarizing/polishing the resulting IC structure of FIG. 2E, for example. In some embodiments, the ILD layer 250 may include any suitable material, such as a dielectric, oxide (e.g., silicon dioxide), and/or nitride (e.g., silicon nitride) material, or any other suitable electrically insulating material as will be apparent in light of this disclosure. ILD layer 250 may be formed to allow for additional gate stack processing and/or for S/D contact processing, as can be understood based on this disclosure.

Method 100 of FIG. 1 continues with optionally replacing 112 the dummy gate stack with a final gate stack, in accordance with some embodiments. Recall that in embodiments not employing nanowire (or nanoribbon or GAA) transistor configurations, a gate first process flow (e.g., up-front hi-k gate process) may be used, where the final gate stack is initially formed prior to the S/D processing and a dummy gate stack is not utilized, such as forming the final gate stack at box 104 of method 100 in FIG. 1, for example. In some such gate first process flows, process 112 need not be performed, as the final gate would have been formed in the structure of FIG. 2B, for example. However, in this example embodiment, a dummy gate was utilized in a gate last process flow, and thus, the dummy gate stack of FIG. 2E (including dummy gate dielectric layer 212 and dummy gate 214) were removed and replaced with the final gate stack of FIG. 2F, which includes gate dielectric layer 262 and gate 264. In some embodiments, the gate stack processing may include any suitable techniques, such as those used for replacement gate (e.g., replacement metal gate (RMG)) techniques, for instance. As shown in this example embodiment, the gate dielectric layer 262 is conformally deposited, such that is has a substantially similar thickness on all surfaces upon which it grows and tracks with the topography of the surfaces upon which it grows (e.g., within spacers 220). However, that need not be the case in all embodiments, such that it may only be present in the end structure below gate 264 (e.g., between gate 264 and channel region 202), for instance. In embodiments that employ a gate last process flow, the techniques can provide an opportunity to perform channel region processing, such as forming one or more nanowires/nanoribbons in the channel region or performing any other desired processing as will be apparent in light of this disclosure.

In some embodiments, gate dielectric layer 262 may include silicon dioxide and/or a high-k dielectric material, depending on the end use or target application. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 262 to improve its quality when a high-k material is used, for example. In some embodiments, gate (or gate electrode) 264 may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate dielectric layer 262 may be relatively thin, such as having a thickness in the range of 1-20 nm, for example, or some other suitable thickness as will be apparent in light of this disclosure. In some embodiments, gate 264 may have a thickness in the range of 10-200 nm, for example, or some other suitable thickness as will be apparent in light of this disclosure. In some embodiments, gate dielectric layer 262 and/or gate 264 may include a multilayer structure of two or more material layers, for example. In some embodiments, gate dielectric layer 262 and/or gate 264 may include grading (e.g., increasing and/or decreasing) the content/concentration of one or more materials in at least a portion of the feature(s). Additional layers may be present in the final gate stack, in some embodiments, such as one or more work function layers or other suitable layers, for example.

Figure 2G:
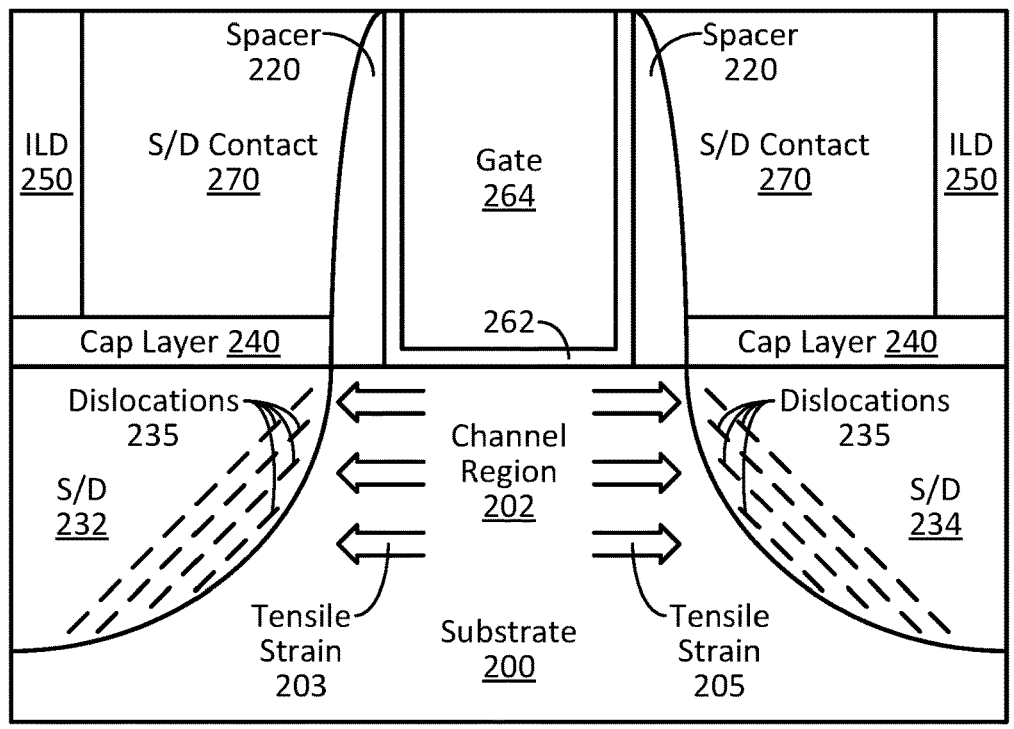
Figure 2G:
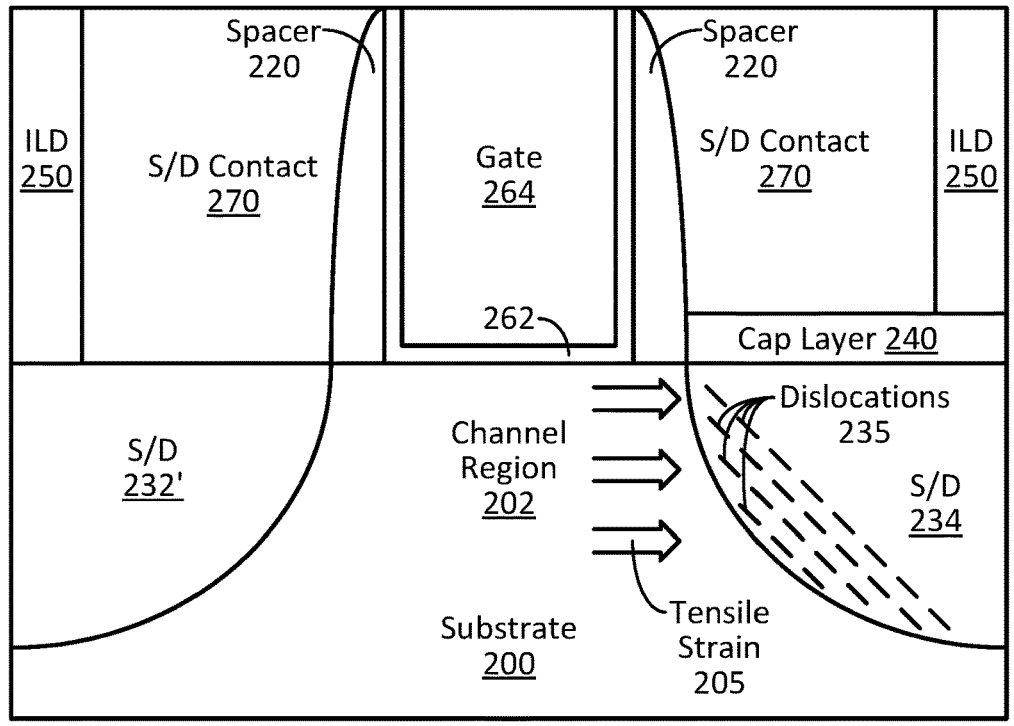

Method 100 of FIG. 1 continues with performing 114 S/D contact processing, in accordance with some embodiments. For instance, in the example embodiment of FIG. 2G (continuing from FIG. 2F), S/D contact processing 114 may have included forming S/D contact trench etches in ILD layer 250 and forming the S/D contact features 270 using any suitable deposition process (e.g., CVD, ALD, PVD). In some embodiments, S/D contact formation may include silicidation, germinidation, annealing processes, and/or any other suitable pre-treatment processes, for example. In some embodiments, S/D contacts 270 may include any suitable material, such as metal or metal alloy material (or other suitably electrically conductive material). For instance, S/D contacts 270 may include aluminum or tungsten, although any suitable conductive metal or alloy can be used, such as silver, nickel-platinum, or nickel-aluminum, for example. In some embodiments, one or more of the S/D contacts 270 may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact regions, such as adhesion layers (e.g., titanium nitride) and/or liner or barrier layers (e.g., tantalum nitride), if so desired. FIG. 2G' illustrates an example IC structure after S/D contact processing 114 has been performed where the S/D scheme used is that from FIG. 2D', to continue the process flow for that example structure and to illustrate some variations of the techniques described herein, in accordance with some embodiments. Therefore, S/D contacts 270 may be in physical contact with the main S/D regions (e.g., 232, 234 and/or 232') in some embodiments, while S/D contacts 270 may be in physical contact with cap layer 240, as can be understood based on this disclosure.

Method 100 of FIG. 1 continues with completing 116 IC processing, as desired, in accordance with some embodiments. Such additional processing to complete the IC may include back-end or back-end-of-line (BEOL) processing to form one or more metallization layers and/or to interconnect the transistor devices formed, for example. Any other suitable processing may be performed, as will be apparent in light of this disclosure. Note that the processes 102-116 of method 100 are shown in a particular order in FIG. 1 for ease of description. However, one or more of the processes 102-116 may be performed in a different order or may not be performed at all. For example, box 108 is an optional process that need not be performed if a cap layer as described herein is not desired. Further, box 112 is an optional process that need not be performed in embodiments employing a gate first process flow, for example. Numerous variations on method 100 and the techniques described herein will be apparent in light of this disclosure.

FIG. 3 illustrates a perspective view of an example IC structure, illustrating non-planar transistor configurations formed using the method 100 of FIG. 1, in accordance with some embodiments of the present disclosure. The previous relevant description with respect to all of the aforementioned techniques and features is equally applicable to the example structure of FIG. 3. For example, features from FIG. 2G can be seen in FIG. 3, such as substrate 200, spacers 220, S/D regions 232/234, cap layer 240, and so forth. As shown in FIG. 3, two finned source-channel-drain structures are shown, where the right fin structure includes a finned channel region 302 and the left finned structure includes a nanowire/nanoribbon channel region 402. Recall that such finned structures may have been formed during the optional additional processing in box 102 of method 100 and that such processing may include forming a shallow trench isolation (STI) layer, which is shown as STI layer 204 in FIG. 3. The finned channel region 302 may be used for a multitude of transistor devices, such as FinFET, tri-gate, and double-gate devices, for example. The nanowire/nanoribbon channel region 402 may be used for a nanowire, nanoribbon, or gate-all-around (GAA) transistor device, for example. Although two nanowires/nanoribbons are shown in channel region 402, a nanowire (or nanoribbon or GAA) transistor device formed using the techniques described herein may include any number of nanowires/nanoribbons, such as 1, 2, 3, 4, 5, 6, 7, 8, 9, 10, or more, as can be understood based on this disclosure. Also recall that the techniques may be used to form various different transistor types, such as various field-effect transistors (FETs), including, but not limited to, metal-oxide-semiconductor FETs (MOSFETs) and tunnel-FETs (TFETs). In addition, the techniques may be used to form complementary devices and/or devices including multiple transistors, such as complementary MOS (CMOS) devices and other transistor-based devices. Numerous variations and configurations will be apparent in light of the present disclosure.

Example System

Figure 4:
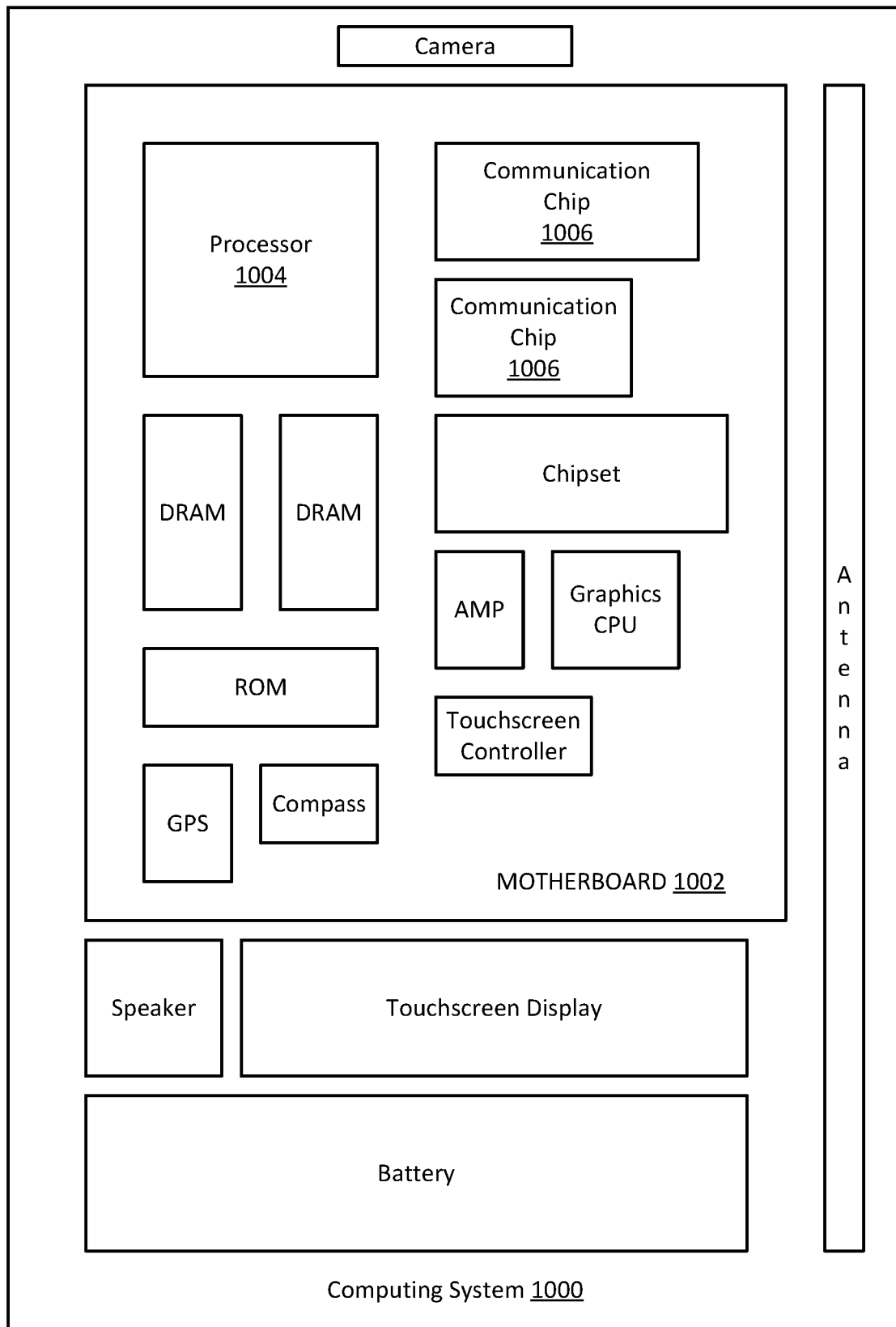
FIG. 4 illustrates a computing system implemented with integrated circuit structures and/or transistor devices formed using the techniques disclosed herein, in accordance with some embodiments of the present disclosure.

FIG. 4 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit (IC) including: a substrate; and a transistor at least one of above and in the substrate, the transistor including a gate, a channel region below the gate, source and drain (S/D) regions adjacent the channel region, wherein at least one of the S/D regions includes n-type dopants and multiple dislocations, S/D contacts electrically connected to each of the S/D regions, and an intervening layer between the at least one S/D region and the S/D contact electrically connected to the at least one S/D region, wherein the intervening layer includes at least one of different material than the at least one S/D region and a higher concentration of n-type dopants relative to the at least one S/D region.

Example 2 includes the subject matter of Example 1, wherein the multiple dislocations include at least four dislocations.

Example 3 includes the subject matter of any of Examples 1-2, wherein the channel region includes tensile strain.

Example 4 includes the subject matter of Example 3, wherein average tensile strain in the channel region is at least 0.2 percent.

Example 5 includes the subject matter of any of Examples 1-4, wherein material included in the at least one S/D region has a greater than 3 percent lattice mismatch with respect to material included in the channel region.

Example 6 includes the subject matter of any of Examples 1-5, wherein the intervening layer includes a higher concentration of n-type dopants than the at least one S/D region.

Example 7 includes the subject matter of any of Examples 1-6, wherein an upper portion of the at least one S/D region includes n-type dopants in a concentration of greater than 1E18 atoms per cubic centimeter.

Example 8 includes the subject matter of any of Examples 1-7, wherein the channel region includes silicon (Si) and the at least one S/D region includes silicon germanium (SiGe) that has a germanium (Ge) concentration of at least 30 percent.

Example 9 includes the subject matter of any of Examples 1-8, wherein material of the at least one S/D region includes at least 30 percent more germanium (Ge) concentration than material of the channel region.

Example 10 includes the subject matter of any of Examples 8-9, wherein the intervening layer includes silicon (Si) and a higher concentration of n-type dopants than the at least one S/D region.

Example 11 includes the subject matter of any of Examples 1-7, wherein the channel region includes indium gallium arsenide (InGaAs) and the at least one S/D region includes indium arsenide (InAs).

Example 12 includes the subject matter of any of Examples 1-7 or 11, wherein material of the at least one S/D region includes at least 27 percent more indium (In) concentration than material of the channel region.

Example 13 includes the subject matter of any of Examples 1-12, wherein both of the S/D regions include n-type dopants and multiple dislocations.

Example 14 includes the subject matter of any of Examples 1-13, wherein the channel region includes at least one of a planar, finned, tri-gate, finned field-effect transistor (FinFET), nanowire, nanoribbon, and gate-all-around (GAA) configuration.

Example 15 includes the subject matter of any of Examples 1-14, wherein the transistor is one of a metal-oxide-semiconductor field-effect transistor (MOSFET) and a tunnel field-effect transistor (TFET).

Example 16 is a complementary metal-oxide-semiconductor (CMOS) device including the subject matter of any of Examples 1-15.

Example 17 is a computing system including the subject matter of any of Examples 1-16.

Example 18 is an integrated circuit (IC) including: a substrate; and a transistor at least one of above and in the substrate, the transistor including a gate, a channel region below the gate, wherein the channel region includes a first material, source and drain (S/D) regions adjacent the channel region, wherein at least one of the S/D regions includes a second material that is doped n-type and has a greater than 2 percent lattice mismatch with respect to the first material, S/D contacts electrically connected to each of the S/D regions, and an intervening layer between the at least one S/D region and the S/D contact electrically connected to the at least one S/D region, wherein the intervening layer includes at least one of different material than the at least one S/D region and a higher concentration of n-type dopants than the at least one S/D region.

Example 19 includes the subject matter of Example 18, wherein the at least one S/D region includes multiple dislocations.

Example 20 includes the subject matter of Example 19, wherein the multiple dislocations include at least four dislocations.

Example 21 includes the subject matter of any of Examples 18-20, wherein the channel region includes tensile strain.

Example 22 includes the subject matter of Example 21, wherein average tensile strain in the channel region is at least 0.2 percent.

Example 23 includes the subject matter of any of Examples 18-22, wherein the intervening layer includes different material than the at least one S/D region.

Example 24 includes the subject matter of any of Examples 18-23, wherein an upper portion of the at least one S/D region includes n-type dopants in a concentration of greater than 1E18 atoms per cubic centimeter.

Example 25 includes the subject matter of any of Examples 18-24, wherein the channel region includes silicon (Si) and the at least one S/D region includes silicon germanium (SiGe) that has a germanium (Ge) concentration of at least 50 percent.

Example 26 includes the subject matter of any of Examples 18-25, wherein material of the at least one S/D region includes at least 50 percent more germanium (Ge) concentration than material of the channel region.

Example 27 includes the subject matter of any of Examples 25-26, wherein the intervening layer includes silicon (Si) and a higher concentration of n-type dopants than the at least one S/D region.

Example 28 includes the subject matter of any of Examples 18-24, wherein the channel region includes indium gallium arsenide (InGaAs) and the at least one S/D region includes indium arsenide (InAs).

Example 29 includes the subject matter of any of Examples 18-24 or 28, wherein material of the at least one S/D region includes at least 35 percent more indium (In) concentration than material of the channel region.

Example 30 includes the subject matter of any of Examples 18-29, wherein both of the S/D regions include n-type dopants and multiple dislocations.

Example 31 includes the subject matter of any of Examples 18-30, wherein the channel region includes at least one of a planar, finned, tri-gate, finned field-effect transistor (FinFET), nanowire, nanoribbon, and gate-all-around (GAA) configuration.

Example 32 includes the subject matter of any of Examples 18-31, wherein the transistor is one of a metal-oxide-semiconductor field-effect transistor (MOSFET) and a tunnel field-effect transistor (TFET).

Example 33 is a complementary metal-oxide-semiconductor (CMOS) device including the subject matter of any of Examples 18-32.

Example 34 is a computing system including the subject matter of any of Examples 18-32.

Example 35 is a method of forming an integrated circuit (IC), the method including: performing source and drain (S/D) processing to form S/D regions of a transistor, a channel region of the transistor between the S/D regions, wherein at least one of the S/D regions includes n-type dopants and multiple dislocations; forming an S/D contact above each of the S/D regions; and forming an intervening layer between the at least one S/D region and the S/D contact above the at least one S/D region, wherein the intervening layer includes at least one of different material than the at least one S/D region and a higher concentration of n-type dopants than the at least one S/D region.

Example 36 includes the subject matter of Example 35, wherein the S/D regions are formed via epitaxial deposition of material of the S/D regions on a substrate, and wherein material included in at least one of the S/D regions includes a lattice mismatch of at least 2.5 percent with respect to material included in the channel region.

Example 37 includes the subject matter of any of Examples 35-36, wherein the intervening layer includes a higher concentration of n-type dopants than the at least one S/D region.

Example 38 includes the subject matter of any of Examples 35-37, further including forming a gate stack above the channel region, the gate stack including a gate and a gate dielectric layer, the gate dielectric layer between the gate and the channel region.

Example 39 includes the subject matter of Example 38, wherein the gate stack is formed using a gate first process flow.

Example 40 includes the subject matter of Example 38, wherein the gate stack is formed using a gate last process flow.

Example 41 includes the subject matter of any of Examples 35-40, wherein the multiple dislocations include at least four dislocations.

Example 42 includes the subject matter of any of Examples 35-41, wherein the channel region includes tensile strain.

Example 43 includes the subject matter of any of Examples 35-42, wherein material of the at least one S/D region includes at least 30 percent more germanium (Ge) concentration than material of the channel region.

Example 44 includes the subject matter of any of Examples 35-42, wherein material of the at least one S/D region includes at least 25 percent more indium (In) concentration than material of the channel region.

Example 45 includes the subject matter of any of Examples 35-44, wherein both of the S/D regions include n-type dopants and multiple dislocations.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit, comprising:
   a monocrystalline region;
   a gate structure above a portion of the monocrystalline region;
   a source or drain region in the monocrystalline region at a side of the gate structure, the source or drain region including a first semiconductor material, a dopant, and multiple dislocations;
   a contact structure over the source or drain region; and
   an intervening layer between the source or drain region and the contact structure, the intervening layer including
      a higher dopant concentration than the source or drain region.

2. The integrated circuit of claim 1, wherein the multiple dislocations include at least four dislocations.

3. The integrated circuit of claim 1, wherein the portion of the monocrystalline region under the gate structure and adjacent the source or drain region includes tensile strain.

4. The integrated circuit of claim 3, wherein average tensile strain in the channel region is at least 0.2 percent.

5. The integrated circuit of claim 1, wherein the source or drain region has a greater than 3 percent lattice mismatch with respect to the monocrystalline region.

6. The integrated circuit of claim 1, wherein the higher dopant concentration of the intervening layer includes a higher concentration of n-type dopant than the source or drain region.

7. The integrated circuit of claim 1, wherein an upper portion of the source or drain region includes an n-type dopant in a concentration of greater than 1E18 atoms per cubic centimeter.

8. The integrated circuit of claim 1, wherein the monocrystalline region includes silicon, and the source or drain region includes silicon and germanium and has a germanium concentration of at least 30 percent.

9. The integrated circuit of claim 1, wherein the source or drain region includes a germanium concentration that is at least 30 percent more than the monocrystalline region.

10. The integrated circuit of claim 9, wherein:
    the intervening layer includes silicon; and
    the higher dopant concentration of the intervening layer includes a higher concentration of n-type dopant than the source or drain region.

11. The integrated circuit of claim 1, wherein the monocrystalline region includes indium gallium arsenide, and the source or drain region includes indium gallium arsenide.

12. The integrated circuit of claim 1, wherein the source or drain region includes at least 27 percent more indium than the monocrystalline region.

13. The integrated circuit of claim 1, wherein the monocrystalline region includes a fin structure, and the gate structure is on multiple sides of the fin structure.

14. The integrated circuit of claim 1, wherein the monocrystalline region includes a nanowire or nanoribbon, and the gate structure wraps around the nanowire or nanoribbon.

15. An integrated circuit comprising:
    a monocrystalline region including a first semiconductor material;
    a gate structure above a portion of the monocrystalline region;
    a source or drain region in the monocrystalline region and adjacent to the portion of the monocrystalline region under the gate structure, the source or drain region including a second semiconductor material that is doped n-type and has a greater than 2 percent lattice mismatch with respect to the first semiconductor material;
    a contact structure over the source or drain region; and
    an intervening layer between the source or drain region and the contact structure, the intervening layer including
        a higher dopant concentration than the source or drain region, and/or
        a semiconductor material different than the second semiconductor material.

16. The integrated circuit of claim 15, wherein the portion of the monocrystalline region under the gate structure and adjacent the source or drain region includes tensile strain.

17. The integrated circuit of claim 15, wherein the higher dopant concentration of the intervening layer includes a higher concentration of n-type dopant than the source or drain region.

18. An integrated circuit, comprising:
    a monocrystalline region of silicon;
    a gate structure above a portion of the monocrystalline region;
    a source or drain region in the monocrystalline region at a side of the gate structure, the source or drain region including germanium at a concentration in excess of 30 percent, such that the portion of the monocrystalline region of silicon under the gate structure includes tensile strain;
    a contact structure over the source or drain region; and
    an intervening layer between the source or drain region and the contact structure, the intervening layer including
        a higher dopant concentration than the source or drain region.

19. The integrated circuit of claim 18, wherein the higher dopant concentration of the intervening layer includes a higher concentration of n-type dopant than the source or drain region.

20. The integrated circuit of claim 18, wherein:
    the intervening layer includes silicon; and
    the higher dopant concentration of the intervening layer includes a higher concentration of n-type dopant than the source or drain region.

* * * * *